(12) United States Patent
Kushihara

(10) Patent No.: US 7,388,527 B2
(45) Date of Patent: Jun. 17, 2008

(54) METHOD OF DETECTING ABNORMALITY OF R/D CONVERTER

(75) Inventor: Hiroshi Kushihara, Nagano-ken (JP)

(73) Assignee: Tamagawa Seiki Kabushiki Kaisha, Nagano-ken (JP)

( * ) Notice: Subject to any disclaimer, the term of this patent is extended or adjusted under 35 U.S.C. 154(b) by 911 days.

(21) Appl. No.: 10/916,466

(22) Filed: Aug. 12, 2004

(65) Prior Publication Data

US 2005/0278090 A1 Dec. 15, 2005

(30) Foreign Application Priority Data

Jun. 1, 2004 (JP) .............................. 2004-163168

(51) Int. Cl.
*H03M 1/48* (2006.01)
(52) U.S. Cl. ....................... 341/114; 341/115
(58) Field of Classification Search ......... 341/111–117
See application file for complete search history.

(56) References Cited

U.S. PATENT DOCUMENTS

| | | | |
|---|---|---|---|
| 5,796,357 A * | 8/1998 | Kushihara | 341/116 |
| 7,157,906 B2 * | 1/2007 | Miya | 324/207.25 |
| 7,343,254 B2 * | 3/2008 | Otsuka et al. | 702/58 |
| 2002/0152039 A1 * | 10/2002 | Fujimoto et al. | 702/36 |
| 2007/0146169 A1 * | 6/2007 | Otsuka et al. | 341/15 |

FOREIGN PATENT DOCUMENTS

| | | |
|---|---|---|
| JP | 05-127758 | 5/1993 |
| JP | 08-289521 | 11/1996 |
| JP | 08-334306 | 12/1996 |
| JP | 09068439 A * | 3/1997 |
| JP | 11118519 A * | 4/1999 |
| JP | 2000-353957 | 12/2000 |
| JP | 2001-082982 | 3/2001 |
| JP | 2003-254780 | 9/2003 |
| WO | WO 2005043089 A1 * | 5/2005 |

* cited by examiner

*Primary Examiner*—Howard Williams
(74) *Attorney, Agent, or Firm*—Wenderoth, Lind & Ponack, L.L.P.

(57) ABSTRACT

To achieve miniaturization of a resolver apparatus as a system, to obtain the resolver apparatus at a low cost, and to improve failsafe by installing an abnormality detection unit and a self-diagnosis circuit within the R/D converter. According to the present invention, an abnormality detecting method for an R/D converter in a resolver apparatus includes detecting abnormalities of at least the resolver itself (1), a cable wiring (2) through which the resolver (1) and the R/D converter (3) are connected to each other, and the R/D converter (3) itself by an abnormality detection unit (4) provided in the R/D converter (3).

9 Claims, 3 Drawing Sheets

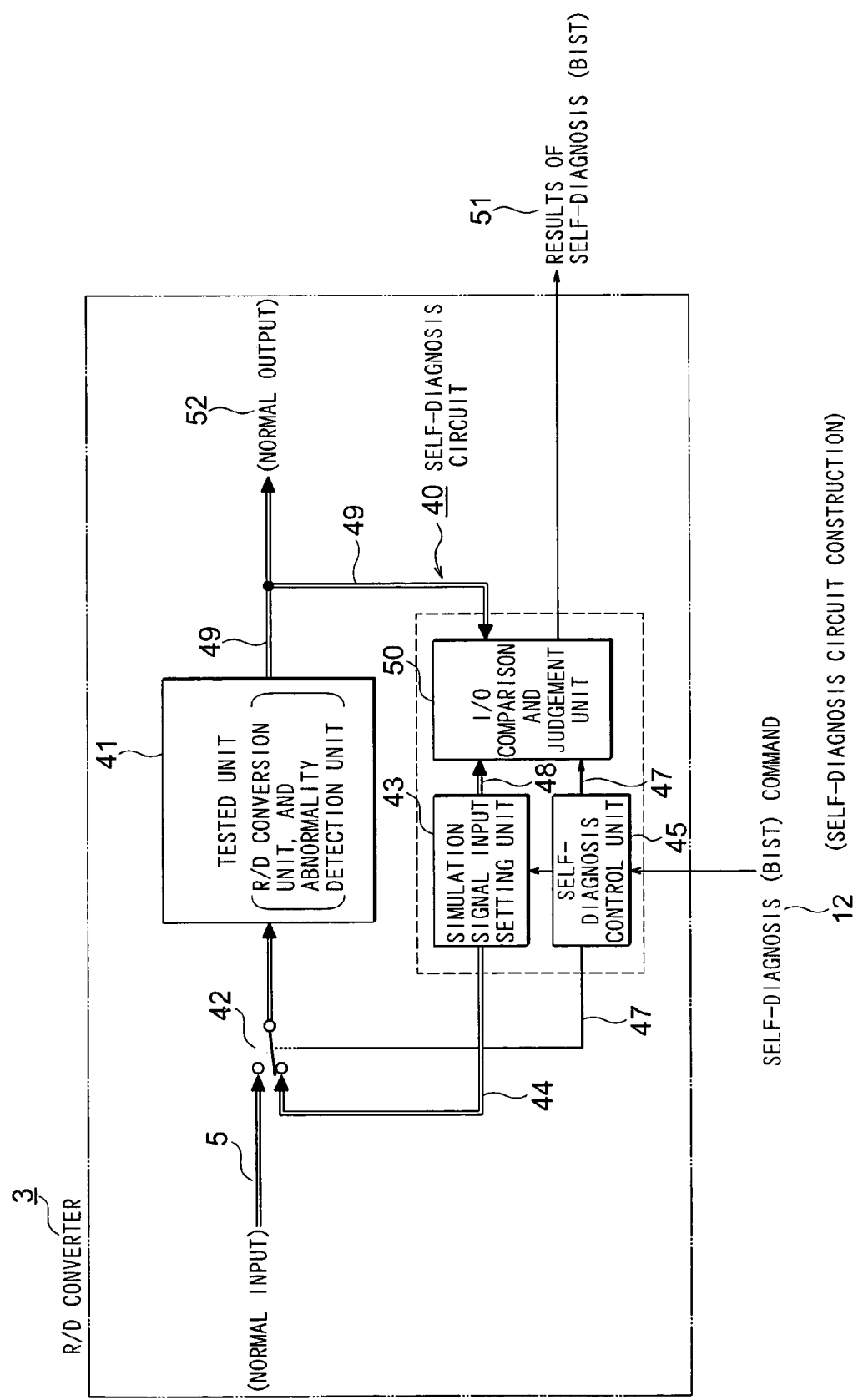

METHOD OF DETECTING ABNORMALITY OF R/D CONVERTER

BACKGROUND OF THE INVENTION

1. Field of the Invention

The present invention relates in general to a method of detecting an abnormality of an R/D converter. In particular, the present invention aims at constructing an inexpensive and simple failsafe system by installing an abnormality detection/self-diagnosis function in an R/D converter to integrate abnormality detection means, which is conventionally provided in an external circuit other than a resolver apparatus, with the resolver apparatus.

2. Description of the Related Art

For a resolver/digital (R/D) converter for carrying out R/D conversion of a resolver which is conventionally used, for example, there is a method including converting an analog signal into a digital signal. This method is described in JP 3,442,316B and U.S. Pat. No. 6,278,388. In this case, most of the failsafe functions such as detecting various abnormalities rely on an external circuit other than a resolver apparatus (a combination of a resolver with an R/D converter), or a host arithmetic and logic unit such as a microcomputer.

In addition, as for a method including detecting disconnection of a resolver, a method described in JP 2000-131096 A can be given as an example.

Since the conventional resolver apparatus is configured in a manner as described above, it has the following problem existing therein.

That is, since the function such as detecting an abnormality of the R/D converter is not complete, the external circuit other than the resolver apparatus, or the host system such as a microcomputer must be used for the abnormality detecting function for realizing the failsafe. As a result, the conventional resolver apparatus is complicated and expensive.

SUMMARY OF THE INVENTION

In the light of the foregoing, it is, therefore, an object of the present invention to construct an inexpensive and simple failsafe system by installing an abnormality detection/self-diagnosis function in an R/D converter to integrate abnormality detection means, which is conventionally implemented in an external circuit other than a resolver apparatus, with the resolver apparatus.

According to the present invention, there is provided an abnormality detecting method for an R/D converter in a resolver apparatus including a resolver for outputting a resolver signal in the form of two-phase sine wave signals as an analog signal obtained by amplitude-modulating a signal of an input rotation angle using an excitation component, and an R/D converter for receiving as its input the resolver signal to convert the resolver signal into a digital angle output, the method including detecting abnormalities of at least the resolver itself, a cable wiring through which the resolver and the R/D converter are connected to each other, and the R/D converter itself with an abnormality detection unit provided in the R/D converter.

Further, the abnormality detecting method includes: connecting a host arithmetic and logic unit to the R/D converter; inputting the resolver signal as a resolver signal monitoring signal to the arithmetic and logic unit; inputting a digital angle output having a parallel form, a serial form and a pulse form as a signal having redundancy from the R/D converter to the arithmetic and logic unit, and inputting a speed output from the R/D converter to the arithmetic and logic unit.

Still further, the abnormality detecting method includes: providing a resolver signal abnormality detection unit and a resolver disconnection detection unit in the R/D converter; detecting unbalance between at least the two-phase sine wave signals by the resolver signal abnormality detection unit; and detecting disconnection of at least a resolver output wiring of the resolver and the cable wiring by the resolver disconnection detection unit.

Yet further, the abnormality detecting method includes: providing an R/D conversion abnormality detection unit and an other abnormalities detection unit in the R/D converter; monitoring at least one of a control deviation in a tracking system and a phase lock state in a PLL system by the R/D conversion abnormality detection unit to thereby detect an abnormality in operation of the R/D converter itself; and monitoring a calorification state of an IC circuit within the R/D converter by the other abnormalities detection unit to thereby detect an abnormally high temperature state of the IC circuit.

Yet further, the abnormality detecting method includes: encoding abnormal contents of the operation abnormality state and the abnormally high temperature state to be outputted for indicating the operation abnormality state and the abnormally high temperature state.

Yet further, in the abnormality detecting method, the R/D converter includes a self-diagnosis circuit having at least a function for verifying whether or not R/D conversion itself is normally carried out, the method including: inputting a self-diagnosis command to the self-diagnosis circuit to thereby detect whether or not the R/D conversion itself is normally carried out.

Yet further, in the abnormality detecting method, the R/D converter includes a self-diagnosis circuit having at least a function for verifying whether or not the resolver signal abnormality detection unit and the resolver disconnection detection unit normally operate, the method including: inputting a self-diagnosis command to the self-diagnosis circuit to thereby detect whether or not the resolver signal abnormality detection unit and the resolver disconnection detection unit normally operate.

Yet further, in the abnormality detecting method, the R/D converter includes a self-diagnosis circuit having at least a function for verifying whether or not the R/D conversion abnormality detection unit and the other abnormalities detection unit normally operate, the abnormality detecting method comprising inputting a self-diagnosis command to the self-diagnosis circuit to thereby detect whether or not the R/D conversion abnormality detection unit and the other abnormalities detection unit normally operate.

Furthermore, the abnormality detecting method includes encoding self-diagnosis contents of a self-diagnosis made by the self-diagnosis circuit to be outputted for indicating the results of the self-diagnosis.

The method of detecting an abnormality of an R/D converter according to the present invention is constituted as described above. Accordingly, the following effects can be obtained.

(1) Integration of various abnormality detecting functions which has not been able to be realized and new establishment of a self-diagnosis (hereinafter referred to as "a BIST" for short) function are realized, and moreover an angle output is given redundancy, which results in abnormality detection means being installed in the R/D converter (R/D conversion IC) as much as possible in terms of the resolver system. Hence, the abnormality detection in the resolver system can be unified, and thus it becomes possible to construct a simple, inexpensive and reliable failsafe system.

(2) Information which can be provided to a host system (host arithmetic and logic unit) is certainty of angle information corresponding to a function essential to the resolver system, and certainty of abnormality detection information. Thus, it is possible to reduce a load with respect to the resolver system management for the failsafe system construction which is conventionally carried out in the host system.

(3) Although the system performance is not complemented and maintained with any other normal system, when a fail occurs as in a case where a resolver system is constructed in the form of a double or triple system while depending on a failsafe level at which a host system aims, if the R/D converter having an abnormality detection unit installed therein according to the present invention is used, the double system or triple system can be easily realized at a low cost.

(4) The abnormal contents and the self-diagnosis results are encoded to be outputted, whereby the specific contents can be identified, and hence the action for coping with the occurrence of abnormality can be made clear.

(5) It can be checked in terms of the BIST whether or not the functions of the various abnormality detection units in the R/D converter are normal, and hence the reliability of the abnormality detecting function can be greatly enhanced.

BRIEF DESCRIPTION OF THE DRAWINGS

In the accompanying drawings:

FIG. 3 is a block diagram concretely showing a self-diagnosis circuit shown in FIG. 1.

DETAILED DESCRIPTION OF THE PREFERRED EMBODIMENTS

A preferred embodiment of a method of detecting an abnormality of an R/D converter according to the present invention will hereinafter be described in detail with reference to the accompanying drawings.

Figure 1:
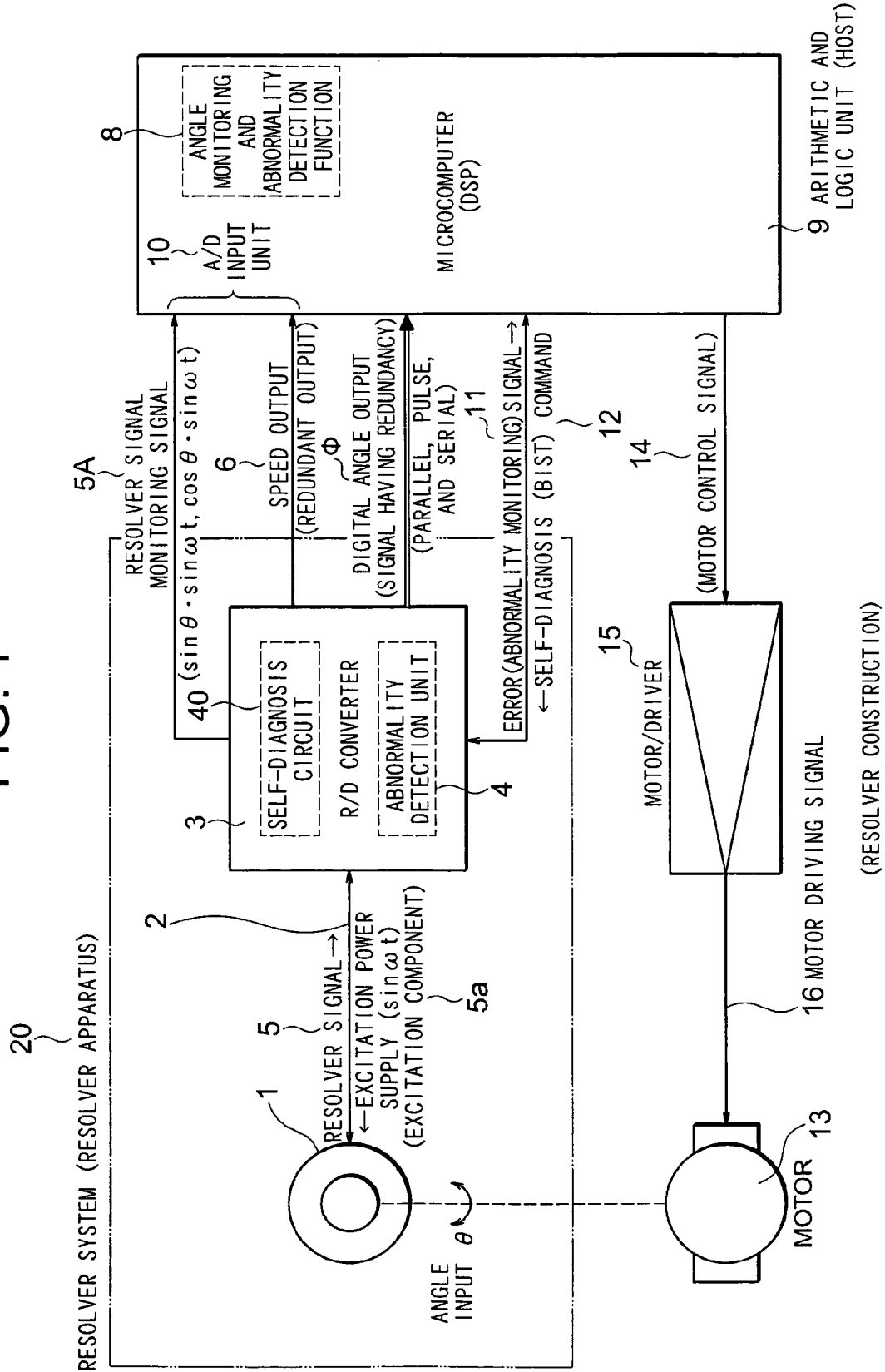
FIG. 1 is a block diagram for explaining an abnormality detecting method for an R/D converter according to an embodiment of the present invention.

Referring to FIG. 1, reference numeral 1 designates a resolver as a rotation detector. An R/D converter 3 for carrying out the resolver/digital (R/D) conversion is connected to the resolver 1 through a cable wiring 2. An excitation component 5$a$ as a carrier acting as an excitation power supply is supplied from the R/D converter 3 to the resolver 1. A resolver signal 5 (sin θ·sin ωt and cos θ·sin ωt) corresponding to an angle input signal θ is inputted from the resolver 1 to the R/D converter 3.

The R/D converter 3 is provided with an abnormality detection unit 4 for detecting presence or absence of various abnormalities of the R/D converter 3. A speed output signal 6 as a redundant output signal and a digital angle output signal Φ as a signal including three transmission forms, i.e., a parallel transmission form, a pulse transmission form and a serial transmission form and having redundancy are inputted from the R/D converter 3 to an arithmetic and logic unit 9 which includes a host microcomputer and the like and which has an angle monitoring and abnormality detection function 8.

A resolver signal monitoring signal 5A (analog signals of two phases, i.e., sin θ·sin ωt and cos θ·sin ωt) as a monitoring signal outputted from the R/D converter 3 is inputted together with the speed output signal 6 to an A/D input unit 10 of the arithmetic and logic unit 9.

A signal wiring is distributed between the R/D converter 3 and the arithmetic and logic unit 9 so that an error signal 11 used to monitor abnormality is inputted to the arithmetic and logic unit 9, and a BIST command 12 for a BIST is inputted to the R/D converter 3.

A motor driving signal 16 is inputted from a motor driver 15 to which a motor control signal 14 supplied from the arithmetic and logic unit 9 is inputted to a motor 13 connected to the resolver 1 to drive the motor 13.

Consequently, a resolver apparatus 20 as a resolver system is constituted by the resolver 1 and the R/D converter 3.

Figure 2:
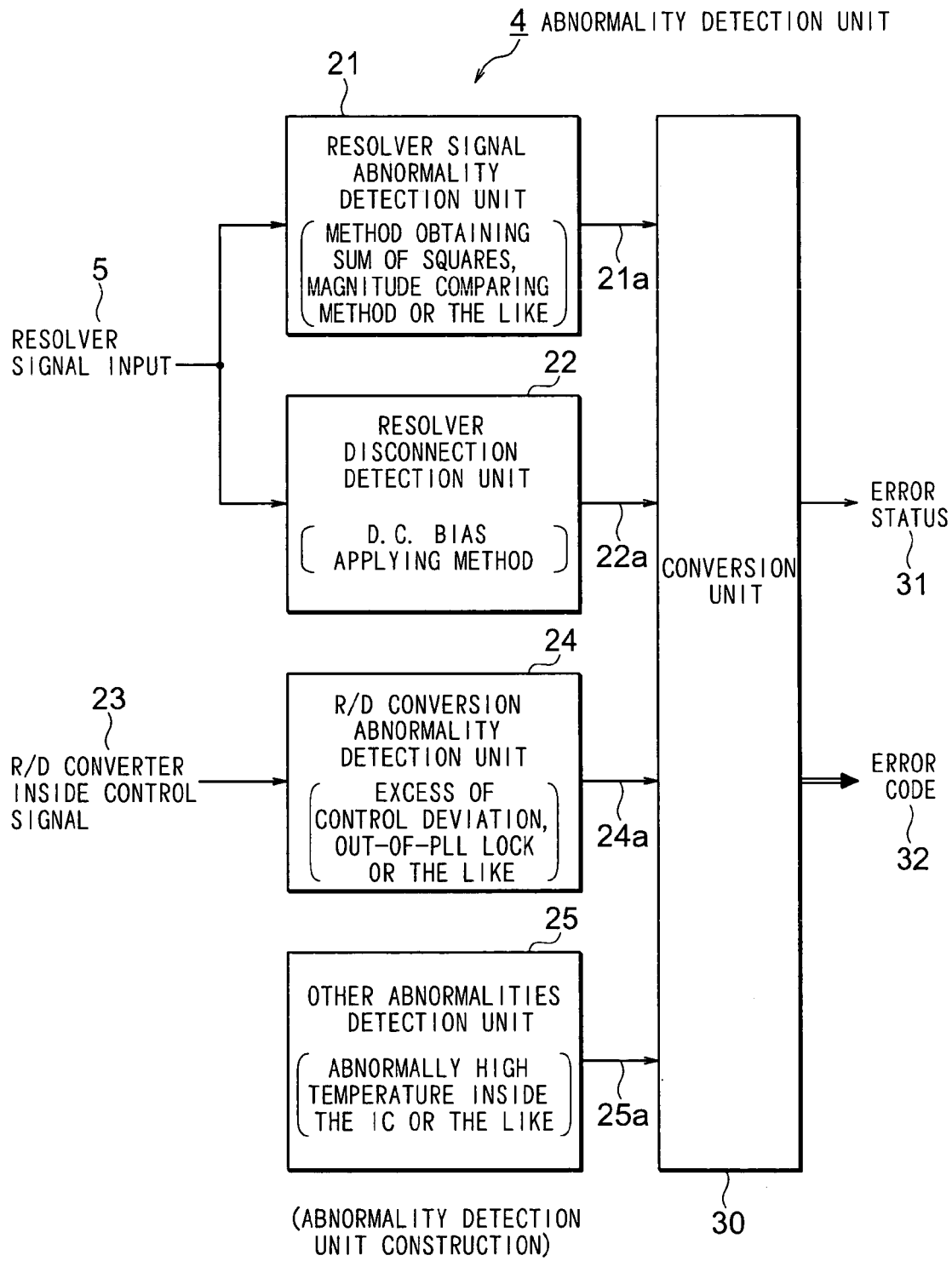
FIG. 2 is a block diagram concretely showing an abnormality detection unit shown in FIG. 1.

The abnormality detection unit 4 is configured as shown in FIG. 2. That is, the abnormality detection unit 4 includes a resolver signal abnormality detection unit 21 and a resolver disconnection detection unit 22 to each of which the resolver signal 5 is inputted, and an R/D conversion abnormality detection unit 24 to which an R/D converter inside control signal 23 is inputted and an other abnormalities detection unit 25 having a function for detecting abnormalities other than those detected by the detection units 21, 22 and 24 (a function for detecting an abnormally high temperature inside an IC circuit, and the like).

Output signals 21$a$, 22$a$, 24$a$ and 25$a$ from the respective detection units 21, 22, 24 and 25 are outputted to the arithmetic and logic unit 9 through a conversion unit 30. Then, the detection results are put together to be outputted in the form of an error status 31. Also, the respective abnormality contents are encoded in an identifiable style to be outputted in the form of an error code 32.

A BIST circuit 40 self-contained in the R/D converter 3 is configured as shown in FIG. 3.

That is, the resolver signal 5 as a normal input signal or a simulation signal input 44 from a simulation signal input setting unit 43 is selectively inputted to a tested unit 41 of the BIST circuit 40 through a switch 42. Turn-ON/OFF of the switch 42 is carried out in accordance with a control signal 47 issued from a BIST unit 45 to which the BIST command 12 is inputted.

An output signal 48 from the simulation signal input setting unit 43, a control signal 47 from the BIST control unit 45, and an output signal 49 from the tested unit 41 are all inputted to an I/O comparison and judgment unit 50. The results 51 of the BIST which, similarly to the error code 32, are identifiable are outputted in the form of a BIST code from the I/O comparison and judgment unit 50. The output signal 49 is outputted as a normal output signal 52 when operations other than the execution of the BIST are performed.

Next, an operation of the resolver apparatus 20 will hereinafter be described.

First of all, the resolver apparatus 20 constituted by the rotation detector (resolver) and the R/D converter in the present invention has the following two important functions, with respect to an abnormality detecting method, in the R/D converter.

(1) An abnormality detection function . . . a function for constantly monitoring an abnormal state of the resolver apparatus.

(2) A BIST function . . . a test function for intentionally verifying a normal operation of the resolver apparatus 20 itself on the basis of an external signal.

Moreover, in order to enhance the authenticity of the output data itself, the present invention aims at giving the following two kinds of information to the host system in which the resolver apparatus is submitted for an application by giving the redundancy to the output and by including a parity signal used to prevent an error on an output interface, thereby contributing to the construction of a failsafe system. That is, the following two points are provided as information:

(1) There is certainty in abnormal information (certainty of abnormality).
(2) There is certainty in output data (it is judged that there is no error in data itself).

Here, a configuration of the resolver system will be described with reference to FIG. 1 by giving as an example a motor control system which is considered to be a general host system.

The resolver apparatus 20 is constituted by the rotation detector (resolver) 1 and the R/D converter 3. The resolver apparatus 20 receives as its input a signal of a mechanical axis rotation angle θ sent from the motor 13 to convert the received signal into a digital signal, and provides the resultant digital signal as an angle output signal for the host arithmetic and logic unit 9. This angle output signal is outputted simultaneously and in parallel in three different kinds of forms, i.e., a parallel transmission output signal, a serial transmission output signal and a pulse output signal to ensure the redundancy for the output interface. Also, a parity signal is contained in each of the parallel data and the serial data, and hence functions as an error detection signal used to directly detect an error in the transmission/reception data itself.

The speed output signal 6 is provided as a measure for increasing the certainty of the angle output signal itself. The speed output signal 6 is taken out as speed information from an R/D conversion loop of the R/D converter 3. While the speed output signal 6 can be directly utilized as a speed signal, it can not be utilized as angle information in any way. However, if the speed output signal 6 is integrated in the host arithmetic and logic unit 9, then it can be changed into an angle. Accordingly, a redundant system can be constituted on the basis of two kinds of angle information obtained from the three different information sources of the R/D converter 3.

The error (abnormality monitoring) signal 11 is abnormality information obtained from the abnormality detection function and the BIST function, and is provided to the host system. In addition, the BIST command 12 is issued from the host arithmetic and logic unit 9, and the R/D converter 3 carries out the BIST in accordance with this signal.

The resolver signal monitoring signal 5A is obtained by signal-converting the two-phase sine wave signals (sin θ·sin ωt and cos θ·sin ωt) of the rotation detector (resolver) 1 into a signal form which can be directly received by the host arithmetic and logic unit 9, and is provided for the host system as it is. Thus, the processing similar to that in the R/D converter 3 is executed for that resultant signal by the host arithmetic and logic unit 9 to make more reliable the certainty of the output signal of the R/D converter 3 (abnormality information and angle information).

Next, the abnormality detection function of the abnormality detection unit 4 will hereinafter be described with reference to FIG. 2.

With respect to the abnormality detection functions, as shown in FIG. 2, the abnormalities of the contents which are roughly classified into four parts are detected using the four detection units 21, 22, 24 and 25, respectively.

First of all, there is given resolver signal abnormality detection made by the resolver signal abnormality detection unit 21. In the resolver signal abnormality detection, it is detected that the abnormality occurs in the resolver signal 5 itself due to rare short or the like of the resolver. Its detection method is such that the relative balance between the two-phase sine wave signals (sin θ·sin ωt and cos θ·sin θt) of the well known resolver is detected by utilizing a method including obtaining a sum of squares utilizing the principles that the respective sums of squares of SIN and COS are fixed, an amplitude comparison method utilizing the fact that the respective amplitudes of SIN and COS do not simultaneously become lower than a certain level, and the like. However, while these methods each have the angle dependency, and hence when the resolver 1 is stationary, the abnormality can not be detected over the overall angle range by utilizing each of them, the abnormality may be detected depending on the rotation of the resolver 1.

Secondly, there is given detection of the resolver disconnection made by the resolver disconnection detection unit 22. In the detection of the resolver disconnection, an open state of the resolver signal due to the disconnection of a resolver wiring, the disconnection of a sensor cable, the imperfect contact of a connection connector, or the like is detected over the overall angle range by utilizing the well known D.C. bias applying method described in JP 2000-131096 A (Japanese Patent Application No. 10-305536), entitled "RESOLVER DISCONNECTION DETECTING METHOD", which was specially filed.

Thirdly, there is given detection of the abnormality in the R/D conversion made by the R/D conversion abnormality detection unit 24. In the R/D conversion abnormality detection, the abnormality of the R/D conversion function itself is detected. While its detection method differs depending on the R/D conversion principles, in a negative feedback control system (closed-loop system) represented by a tracking system, the monitoring is carried out so as to prevent the control deviation from becoming equal to or larger than a certain level by utilizing the fact that in a normal state, the control deviation is basically zero, or in a PLL system, it is monitored whether or not the phase is locked. Thus, the abnormality is detected by utilizing such a method.

Fourthly, the abnormality of the R/D conversion IC itself is detected as the abnormality contents other than those detected by the first to third detection unit 21, 22 and 24. That is, there is detected the abnormally high temperature (calorification) inside the IC due to a failure inside the IC, an over-current of a self-contained excitation amplifier, or the like.

The first to fourth abnormality detection results, as described above, are finally put together to be outputted in the form of the error status 31, while their abnormality contents are also encoded in the identifiable style to be outputted in the form of the error code 32.

Next, the self-diagnosis (BIST) function will hereinafter be described with reference to FIG. 3. The BIST function is a function for, in accordance with the BIST command issued from the outside (the host arithmetic and logic unit 9), intentionally testing whether or not the tested unit (the R/D conversion unit and the abnormality detection unit) which is an object of the BIST normally operates. The test results are encoded in the form of the BIST results so as for their test contents to be identifiable to be outputted in the form of the BIST code similarly to the error code.

The BIST method is such that the predetermined simulation signal input 44 is inputted instead of the original input signal to the tested unit 41 to be compared with the output signal obtained on the basis of the simulation signal input 44, and it is checked, depending on whether or not the expected results are obtained, if the operation of the tested unit 41 is normal.

For example, in the BIST in the R/D conversion unit, the resolver signal 5 having an angle (electrical angle), such as 0°, 45° or 270° which can be generated from the ideal resolver signal 5 is set as the simulation signal input 44 to thereby allow the BIST results to be easily and accurately obtained.

For the BIST in the abnormality detection unit 4, the resolver signal having a corresponding abnormality is set as the simulation signal input in each of the resolver signal abnormality detection unit 21 and the resolver disconnection detection unit 22, and the normal operation is then judged depending on whether or not the abnormality concerned can be detected. In addition, the BIST in the R/D conversion abnormality detection unit 24 is made by intentionally making the control system connected to the R/D conversion abnormal by utilizing a method including disconnecting the closed loop of the negative feedback control system for example. However, while it is basically difficult to carry out the BIST using the simulation signal input as described above, if a situation in which the negative feedback control system does not normally operate, or the PLL is not locked, is caused using the simulation signal input, the BIST can be equivalently carried out for the R/D conversion abnormality detection unit. It should be noted that it is currently difficult to simply carry out the BIST with respect to detection of other abnormalities such as abnormally high temperature inside the IC.

Next, the above-mentioned operation of the present invention is summarized as follows.

The abnormalities of at least the resolver 1 itself, the cable wiring 2 through which the resolver 1 and the R/D converter 3 are connected to each other, and the R/D converter 3 itself can be detected by the abnormality detection unit 4 provided in the R/D converter 3;

the host arithmetic and logic unit 9 is connected to the R/D converter 3, and thus the resolver signal 5 can be inputted as the resolver signal monitoring signal 5A to the arithmetic and logic unit 9, the digital angle output Φ having the three forms, i.e., the parallel transmission form, the serial transmission form and the pulse transmission form can be inputted as the signal having the redundancy to the arithmetic and logic unit 9, and moreover the speed output 6 can be inputted as the redundant output to the arithmetic and logic unit 9;

the resolver signal abnormality detection unit 21 and the resolver disconnection detection unit 22 are provided in the R/D detector 3, and thus the relative unbalance between at least the two-phase sine wave signals (sin θ·sin ωt and cos θ·sin ωt) can be detected by the resolver signal abnormality detection unit 21, and the disconnection of at least the resolver output winding of the resolver 1 and the cable wiring 2 can be detected by the resolver disconnection detection unit 22;

the R/D conversion abnormality detection unit 24 and the other abnormalities detection unit 25 are provided in the R/D converter 3, and thus at least the control deviation in the tracking system or the phase lock state in the PLL system can be monitored by the R/D conversion abnormality detection unit 24 to thereby detect the abnormality in operation of the R/D converter 3 itself, and the calorification state of the IC circuit within the R/D converter 3 can be monitored by the other abnormalities detection unit 25 to thereby detect the abnormally high temperature state of the IC circuit;

the R/D converter 3 is provided with the BIST circuit 40 having at least the function for verifying whether or not the R/D conversion itself is normally carried out, and the BIST command 12 can be inputted to the BIST circuit 40 to thereby detect whether or not the R/D conversion is normally carried out;

the R/D converter 3 is provided with the BIST circuit 40 having at least the function for verifying whether or not the resolver signal abnormality detection unit 21 and the resolver disconnection detection unit 22 normally operate, and the BIST command 12 can be inputted to the BIST circuit 40 to thereby detect whether or not the resolver signal abnormality detection unit 21 and the resolver disconnection detection unit 22 normally operate; and the R/D converter 3 is provided with the BIST circuit 40 having at least the function for verifying whether or not the R/D conversion abnormality detection unit 24 and the other abnormalities detection unit 25 normally operate, and the BIST command 12 can be inputted to the BIST circuit 40 to thereby detect whether or not the R/D conversion abnormality detection unit 24 and the other abnormalities detection unit 25 normally operate.

The present invention can be applied to detection of abnormalities of a control driving system such as a synchronizer, an encoder or a motor in addition to the R/D converter.

What is claimed is:

1. An abnormality detecting method for an R/D converter in a resolver apparatus comprising a resolver for outputting a resolver signal in the form of two-phase sine wave signals as an analog signal obtained by amplitude-modulating a signal of an input rotation angle using an excitation component, and an R/D converter for receiving as its input the resolver signal to convert the resolver signal into a digital angle output, the method comprising:

detecting abnormalities of at least the resolver itself, a cable wiring through which the resolver and the R/D converter are connected to each other, and the R/D converter itself with an abnormality detection unit provided in the R/D converter.

2. An abnormality detecting method for an R/D converter according to claim 1, further comprising:

connecting a host arithmetic and logic unit to the R/D converter;

inputting the resolver signal as a resolver signal monitoring signal to the arithmetic and logic unit;

inputting digital angle outputs having a parallel form, a serial form and a pulse form as a signal having redundancy from the R/D converter to the arithmetic and logic unit; and inputting a speed output signal from the R/D converter to the arithmetic and logic unit.

3. An abnormality detecting method for an R/D converter according to claim 1, further comprising:

providing a resolver signal abnormality detection unit and a resolver disconnection detection unit in the R/D converter; and detecting unbalance between at least the two-phase sine wave signals by the resolver signal abnormality detection unit; and detecting disconnection of at least a resolver output wiring of the resolver and the cable wiring by the resolver disconnection detection unit.

4. An abnormality detecting method for an R/D converter according to claim 3, wherein the R/D converter further includes a self-diagnosis circuit having at least a function for verifying whether or not the resolver signal abnormality detection unit and the resolver disconnection detection unit normally operate, the abnormality detecting method further comprising inputting a self-diagnosis command to the self-diagnosis circuit to thereby detect whether or not the resolver signal abnormality detection unit and the resolver disconnection detection unit normally operate.

5. An abnormality detecting method for an R/D converter according to claim 1, further comprising:

providing an R/D conversion abnormality detection unit and an other abnormalities detection unit in the R/D converter;

monitoring at least one of a control deviation in a tracking system and a phase lock state in a PLL system by the R/D conversion abnormality detection unit to thereby detect an abnormality in operation of the R/D converter itself; and monitoring a calorification state of an IC circuit within the R/D converter by the other abnormalities detection unit to thereby detect an abnormally high temperature state of the IC circuit.

6. An abnormality detecting method for an R/D converter according to claim 5, further comprising encoding abnormal contents of the operation abnormality state and the abnormally high temperature state to be outputted for indicating the operation abnormality state and the abnormally high temperature state.

7. An abnormality detecting method for an R/D converter according to claim 5, wherein the R/D converter further includes a self-diagnosis circuit having at least a function for verifying whether or not the R/D conversion abnormality detection unit and the other abnormalities detection unit normally operate, the abnormality detecting method further comprising inputting a self-diagnosis command to the self-diagnosis circuit to thereby detect whether or not the R/D conversion abnormality detection unit and the other abnormalities detection unit normally operate.

8. An abnormality detecting method for an R/D converter according to claim 1, wherein the R/D converter further includes a self-diagnosis circuit having at least a function for verifying whether or not R/D conversion itself is normally carried out, the abnormality detecting method further comprising inputting a self-diagnosis command to the self-diagnosis circuit to thereby detect whether or not the R/D conversion itself is normally carried out.

9. An abnormality detecting method for an R/D converter according to any one of claims 8, further comprising encoding self-diagnosis contents of a self-diagnosis made by the self-diagnosis circuit to be outputted for indicating the results of the self-diagnosis.

\* \* \* \* \*